(12) United States Patent
De Brosse et al.

(10) Patent No.: US 8,889,433 B2
(45) Date of Patent: Nov. 18, 2014

(54) SPIN HALL EFFECT ASSISTED SPIN TRANSFER TORQUE MAGNETIC RANDOM ACCESS MEMORY

(71) Applicant: International Business Machines Corporation, Armonk, NY (US)

(72) Inventors: John K. De Brosse, Colchester, VT (US); Luqiao Liu, Croton-on-Hudson, NY (US); Daniel Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/835,355

(22) Filed: Mar. 15, 2013

(65) Prior Publication Data

US 2014/0264511 A1    Sep. 18, 2014

(51) Int. Cl.
*H01L 21/32* (2006.01)
*H01L 21/02* (2006.01)
*H01L 43/06* (2006.01)
*H01L 43/14* (2006.01)

(52) U.S. Cl.
CPC ............. *H01L 43/065* (2013.01); *H01L 43/14* (2013.01)
USPC ............................................. 438/3; 438/448

(58) Field of Classification Search
CPC ... H01L 27/222; H01L 27/224; H01L 27/226; H01L 27/228; H01L 2924/1441; H01L 27/11502
USPC .................................................... 438/3, 448
See application file for complete search history.

(56) References Cited

U.S. PATENT DOCUMENTS

| | | | |
|---|---|---|---|
| 5,652,445 | A | 7/1997 | Johnson |
| 6,256,223 | B1 | 7/2001 | Sun |
| 6,403,999 | B1 | 6/2002 | O'Handley et al. |
| 8,093,897 | B2 | 1/2012 | Pan |
| 8,295,006 | B2 | 10/2012 | Sugano et al. |
| 2004/0208053 | A1* | 10/2004 | Hayakawa ............ 365/158 |
| 2009/0224300 | A1* | 9/2009 | Yamagishi et al. ............ 257/295 |
| 2010/0027330 | A1* | 2/2010 | Koo et al. .................... 365/170 |
| 2010/0034014 | A1* | 2/2010 | Ohno et al. ................... 365/158 |
| 2010/0073998 | A1* | 3/2010 | Nakayama et al. ............ 365/158 |
| 2010/0097063 | A1* | 4/2010 | Ando et al. .................. 324/316 |
| 2010/0193889 | A1* | 8/2010 | Nagahara et al. ............. 257/421 |
| 2010/0226167 | A1* | 9/2010 | Kajiyama .................... 365/158 |
| 2010/0244163 | A1* | 9/2010 | Daibou et al. ................ 257/421 |
| 2011/0037108 | A1* | 2/2011 | Sugiura et al. ............... 257/295 |

(Continued)

OTHER PUBLICATIONS

Wang et al., "Low-power non-volatile spintronic memory: STT-RAM and beyond," J. Phys. D: Appl. Phys. 46 (2013) 074003 (10pp).*

(Continued)

*Primary Examiner* — Jarrett Stark
*Assistant Examiner* — Mohammad M Hoque
(74) *Attorney, Agent, or Firm* — Cantor Colburn LLP; Vazken Alexanian (57) ABSTRACT

Embodiments are directed to providing a spin hall effect (SHE) assisted spin transfer torque magnetic random access memory (STT-MRAM) device by coupling a magnetic tunnel junction (MTJ) to a SHE material, and coupling the SHE material to a transistor. Embodiments are directed to a spin transfer torque magnetic random access memory (STT-MRAM) device comprising: a magnetic tunnel junction (MTJ) coupled to a spin hall effect (SHE) material, and a transistor coupled to the SHE material.

8 Claims, 7 Drawing Sheets

(56) References Cited

U.S. PATENT DOCUMENTS

| | | |
|---|---|---|
| 2011/0189851 A1 | 8/2011 | Jeong et al. |
| 2011/0194338 A1* | 8/2011 | Baek et al. ............. 365/158 |
| 2012/0012956 A1* | 1/2012 | Saitoh et al. ............. 257/427 |
| 2013/0126996 A1* | 5/2013 | Jeong ............. 257/421 |

OTHER PUBLICATIONS

L. Liu et al., "Magnetic switching by spin torque from the spin Hall effect," arXiv:1110.6846, Oct. 31, 2011, 41 pages.

L. Liu et al., "Spin-Torque Switching with the Giant Spin Hall Effect of Tantalum," Science, vol. 336, No. 6081, May 4, 2012, pp. 555-558.

C.-F. Pai et al., "Spin transfer torque devices utilizing the giant spin Hall effect of tungsten," Applied Physics Letters, vol. 101, Issue 12, 2012, 122404, 4 pages.

L. Xue et al., "Resonance Measurement of Nonlocal Spin Torque in a Three-Terminal Magnetic Device," Phys. Rev. Lett., vol. 108, 2012, 147201, 4 pages.

Non Final Office Action for U.S. Appl. No. 13/967,694, dated Dec. 5, 2013, 26 pages.

\* cited by examiner

FIG. 1A

PRIOR ART

SPIN HALL EFFECT ASSISTED SPIN TRANSFER TORQUE MAGNETIC RANDOM ACCESS MEMORY

FIELD OF INVENTION

The present invention relates generally to computer memory technology, and more specifically, to generating spin current for spin transfer torque magnetic random access memory (STT-MRAM) using a spin hall effect (SHE).

DESCRIPTION OF RELATED ART

In a typical spin transfer torque magnetic random access memory (STT-MRAM) device that is composed of a magnetic tunnel junction (MTJ) and a field effect transistor (FET), the efficiency of the spin transfer torque switching is limited by the spin polarization of the MTJ, whose upper limit cannot exceed one (1). A lower bound is therefore established for a writing current that could be achieved in an MTJ based STT-MRAM. The spin hall effect (SHE) may be used to generate spin current. SHE may be used as an alternative to using a spin filtering effect inside a MTJ. Using SHE, a spin current is generated in a transverse direction while a charge current flows in a longitudinal direction. For each electron that passes through the material with the SHE, there can be more than one spin injected into an adjacent ferromagnetic electrode, and therefore, the efficiency for spin angular momentum transferring can be larger than one (1). As such, the SHE could provide an efficient writing mechanism for STT-MRAM.

It can be difficult to combine the SHE with an MTJ. For example, the tunneling current through the MTJ and the current that provides the SHE flow in different paths and in different directions (e.g., orthogonal to one another). In conventional designs, three terminal devices are used where the tunneling current across the MTJ and the current that generates the SHE torque are applied across different pairs of terminals. The three terminal devices require more than one transistor per unit cell to operate properly, resulting in a lower storage density and more complex circuitry.

BRIEF SUMMARY

Embodiments are directed to a method for providing a spin hall effect (SHE) assisted spin transfer torque magnetic random access memory (STT-MRAM) device comprising: coupling a magnetic tunnel junction (MTJ) to a SHE material, and coupling the SHE material to a transistor.

Embodiments are directed to a spin transfer torque magnetic random access memory (STT-MRAM) device comprising: a magnetic tunnel junction (MTJ) coupled to a spin hall effect (SHE) material, and a transistor coupled to the SHE material.

Embodiments are directed to a spin transfer torque magnetic random access memory (STT-MRAM) device comprising: a magnetic tunnel junction (MTJ) coupled to a spin hall effect (SHE) material, and a field effect transistor (FET) coupled to, and misaligned from, the SHE material.

Additional features and advantages are realized through the techniques described herein. Other embodiments and aspects are described in detail herein. For a better understanding, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages are apparent from the following detailed description taken in conjunction with the accompanying drawings in which:

DETAILED DESCRIPTION

It is noted that various connections are set forth between elements in the following description and in the drawings (the contents of which are included herein by way of reference). It is noted that these connections in general and, unless specified otherwise, may be direct or indirect and that this specification is not intended to be limiting in this respect. In this regard, a coupling of entities may refer to either a direct or an indirect connection.

In some embodiments, a current that tunnels across a magnetic tunnel junction (MTJ) may be used to provide a spin hall effect (SHE) torque. In some embodiments, an asymmetric bottom lead may be used, such that a tunneling current flows towards one side after it leaves a free layer of the MTJ and generates the SHE torque by itself. The SHE torque may be more than ten times larger than the spin torque of the MTJ. A unit cell for a proposed SHE assisted spin transfer torque magnetic random access memory (STT-MRAM) may include two terminals. For a moderate spin hall angle, a reduction in a non-thermal assisted critical current Ic0 may be realized. The reduction may be large (e.g., greater than two) for short switching pules (e.g., pulse length less than five nanoseconds). The SHE assisted STT-MRAM may provide a large storage density while being energy efficient.

Figure 1A:
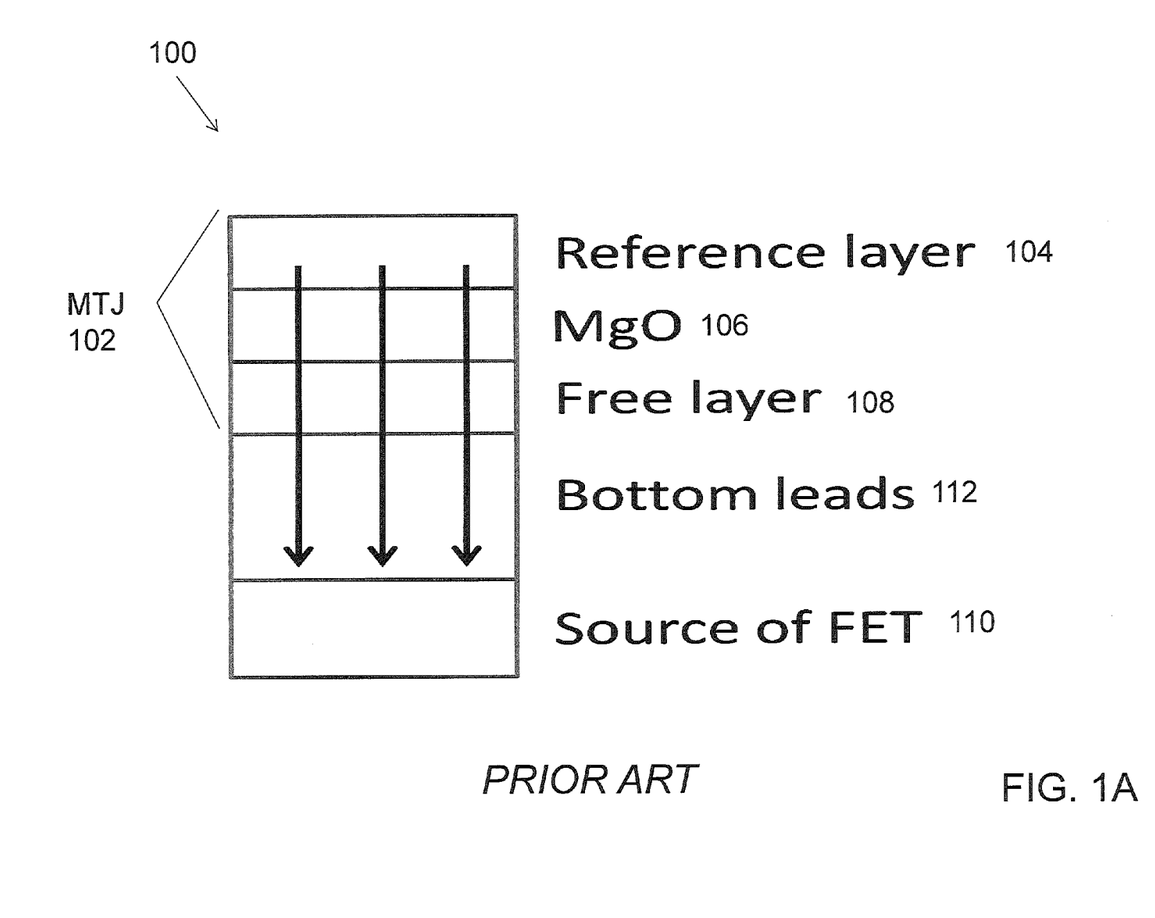
FIG. 1A is a block diagram for a spin transfer torque magnetic random access memory (STT-MRAM) device in accordance with the prior art.

Referring to FIG. 1A, an exemplary block diagram is shown for a conventional STT-MRAM device 100. As shown in FIG. 1A, a MTJ 102 (which may include a reference layer 104, a Magnesium Oxide (MgO) junction 106, and a free layer 108) may be located directly above a source or drain of a field effect transistor (FET) 110. The MTJ 102 and the FET 110 may be coupled together via one or more leads 112.

Based on the architecture for the device 100 shown in FIG. 1, a tunneling current may flow vertically into the source/drain of the FET 110 without causing any additional influence.

Figure 1B:
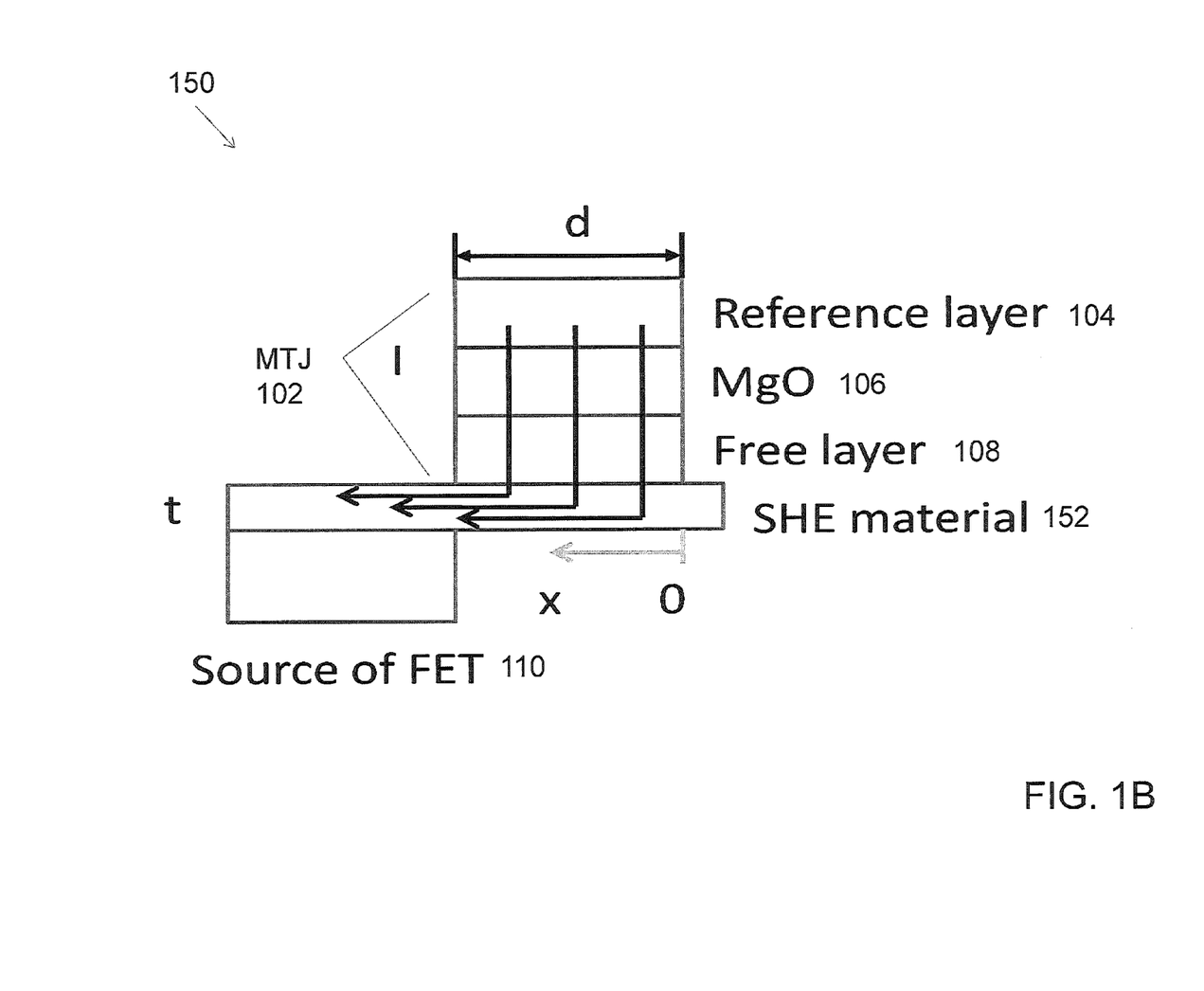
FIG. 1B is a block diagram for a STT-MRAM device incorporating spin hall effect (SHE) material in accordance with one or more embodiments.

Referring to FIG. 1B, an exemplary block diagram is shown for a STT-MRAM device 150. Relative to the device 100, as shown in FIG. 1B an MTJ 102 of the device 150 may be offset or misaligned from the source (or drain) of the FET 110. The free layer 108 may be coupled to the FET 110 via a layer of SHE material 152. The SHE material 152 may have a thickness t. In some embodiments, the thickness t may be on the order of 2 nm to 10 nm. Current that flows under the MTJ 102 may have a horizontal component that may cause a spin current to be generated due to the SHE 152. The generated spin current may be injected into the free layer 108 and exert torque onto the magnetic moment.

The spin torque generated by the horizontally flowing current can be calculated and compared with the torque due to the tunneling current. For example, assuming that the current flowing across the MTJ is I, and the dimension of the MTJ is d-by-d, then the current density may be calculated according to equation #1:

$$\text{Current density} = I/(d*d) \quad \text{Equation \#1}$$

For an MTJ with a spin polarization of P, a spin transfer torque may be calculated according to equation #2:

$$\text{Spin transfer torque} = \hbar bar * P * I/(2e), \quad \text{Equation \#2}$$

where hbar is Planck's constant and e is the charge of an electron.

Due to continuity of current, the horizontally flowing current density j(x) inside the SHE material 152 under the free layer 108 may be calculated according to equation #3:

$$j(x) = I*x*d/[(d*d)*d*t] = I*x/(d*d*t), \quad \text{Equation \#3}$$

where 0<x<d is the distance from the right edge of the MTJ as shown in FIG. 1B.

The average current density <j> inside the SHE material 152 may be calculated according to equation #4:

$$<j> = 0.5 * I/(d*t) \quad \text{Equation \#4}$$

For a SHE material 152 with a spin hall angle of theta, the spin current density <j> may be calculated according to equation #5:

$$<j> = 0.5 * theta * I/(d*t) \quad \text{Equation \#5}$$

For the SHE material 152 with the spin hall angle of theta, the total spin torque onto the free layer 108 may be calculated according to equation #6:

$$\text{Total spin torque} = 0.5 * \hbar bar * theta * I * d/(2*e*t) \quad \text{Equation \#6}$$

For most realistic materials, the spin hall angle (theta) may be comparable to the spin polarization (P). Under such an assumption, the ratio between the spin torque due to the SHE material 152 and that due to the tunneling current may be provided by equation #7:

$$\text{Ratio} = d/(2*t) \quad \text{Equation \#7}$$

Based on equation #7, for exemplary MTJs with a dimension of 20 nm by 20 nm and a SHE layer 152 thickness t of 1 nm, the ratio is equal to ten, which means that the SHE torque is ten times larger than the tunneling current torque.

The spin torque due to the tunneling current and that from the SHE may have different orientations and may exert different influences onto the magnetic moment of the free layer 108. The orientations of the tunneling current spins may be determined by a magnetization direction of the reference layer 104. For conventional spin STT-MTJs, the magnetization of the reference layer 104 and that of the free layer 108 may be collinear with each other. Therefore, the net effect of the spin torque due to the tunneling current may be equivalent to a negative damping torque and the switching may occur when the net effective damping is reduced to zero. The critical current (Ic0) for this type of anti-damping switching may be given by equation #8:

$$Ic0 = (e/\hbar bar) * (mu0 * Ms * V/P) * alpha * H\_K, \quad \text{Equation \#8}$$

where mu0 may be a vacuum permeability, Ms may correspond to a saturation magnetization, V may correspond to the volume, alpha may correspond to a damping coefficient, and H_K may correspond to anisotropy field or the demagnetization field of the free layer 108.

For the spin torque from the SHE 152, the orientation of the spins injected into the free layer 108 may be determined by the rule of: sigma~jc cross js, where sigma is the spin orientation, and jc and js are the vectors of charge current density and spin current density, respectively. Therefore, when the charge current flows horizontally and the spin current flows upward into the free layer 108, the orientation of the spins injected into the free layer 108 may be perpendicular to the plane of FIG. 1B, pointing out or in depending upon the current polarity.

Figure 3A:
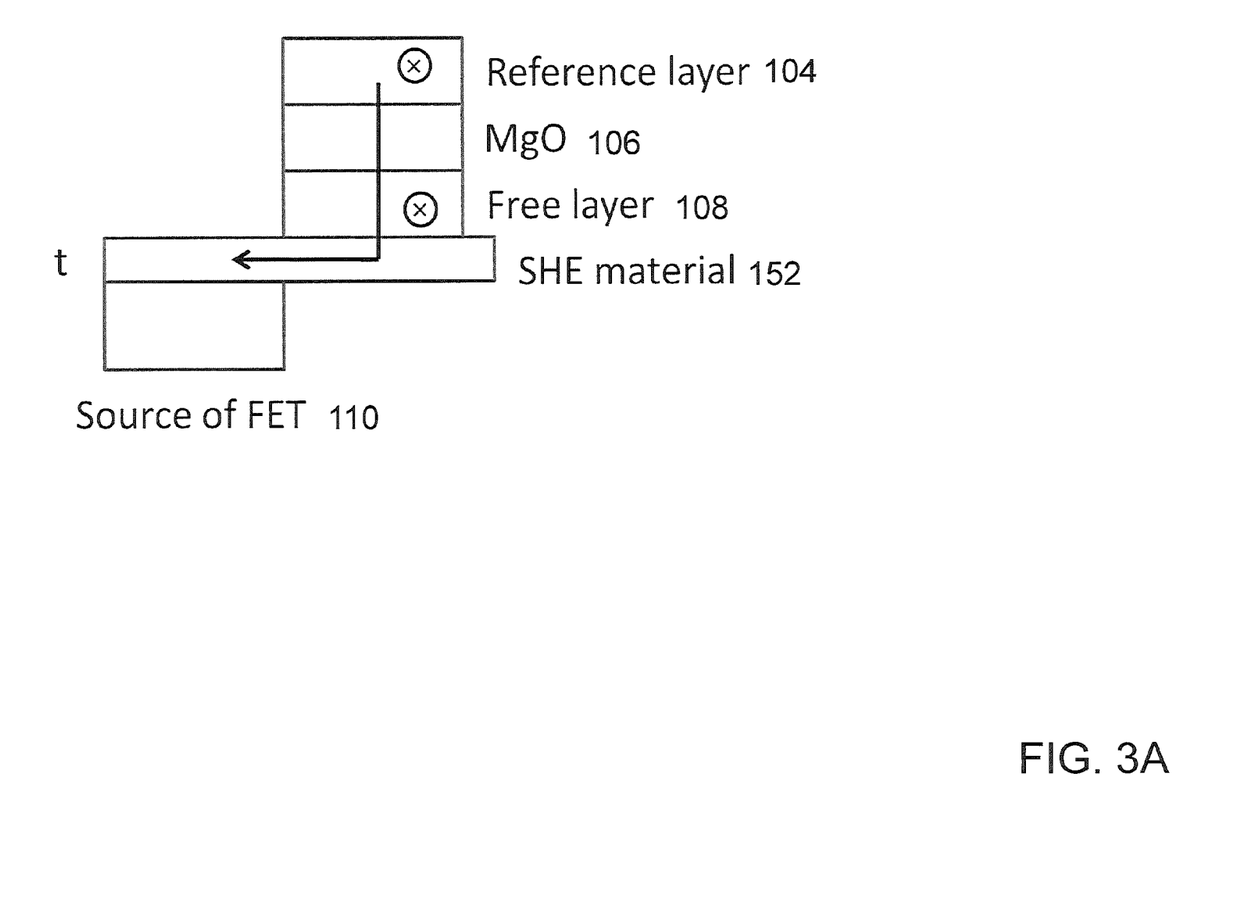
FIG. 3A is a block diagram for a STT-MRAM device illustrating the use of spin Hall effect assistance to switch in-plane magnetized magnetic tunnel junctions (MTJs) in accordance with one or more embodiments.

As is shown in FIG. 3A, for MTJs with in-plane magnetized free layer 108, the injected spins from the SHE material 152 may be collinear with the orientation of the free layer 108 magnetic moment, therefore, the spin torque generated from the SHE can induce the anti-damping switching in the same way as the spin torque from the tunneling current.

The critical switching current due to the SHE for the configuration shown in FIG. 3A may be calculated using equation #9:

$$Ic0\_SHE(\text{in-plane}) = (e/\hbar bar) * (mu0 * Ms * V/P) \\ * alpha * H\_K * 2t/d, \quad \text{Equation \#9}$$

So compared with equation #8, the critical current due to the SHE may be reduced by a factor of 2t/d, which is the spin torque ratio that was calculated using equation #7. Similar to the above description regarding equation #7, for exemplary MTJs with a dimension of 20 nm by 20 nm and a SHE layer 152 thickness t of 1 nm, the critical current for the geometry shown in FIG. 3A is more than 10 times smaller than the critical current of a conventional MTJ as is shown in FIG. 1A.

Figure 3B:
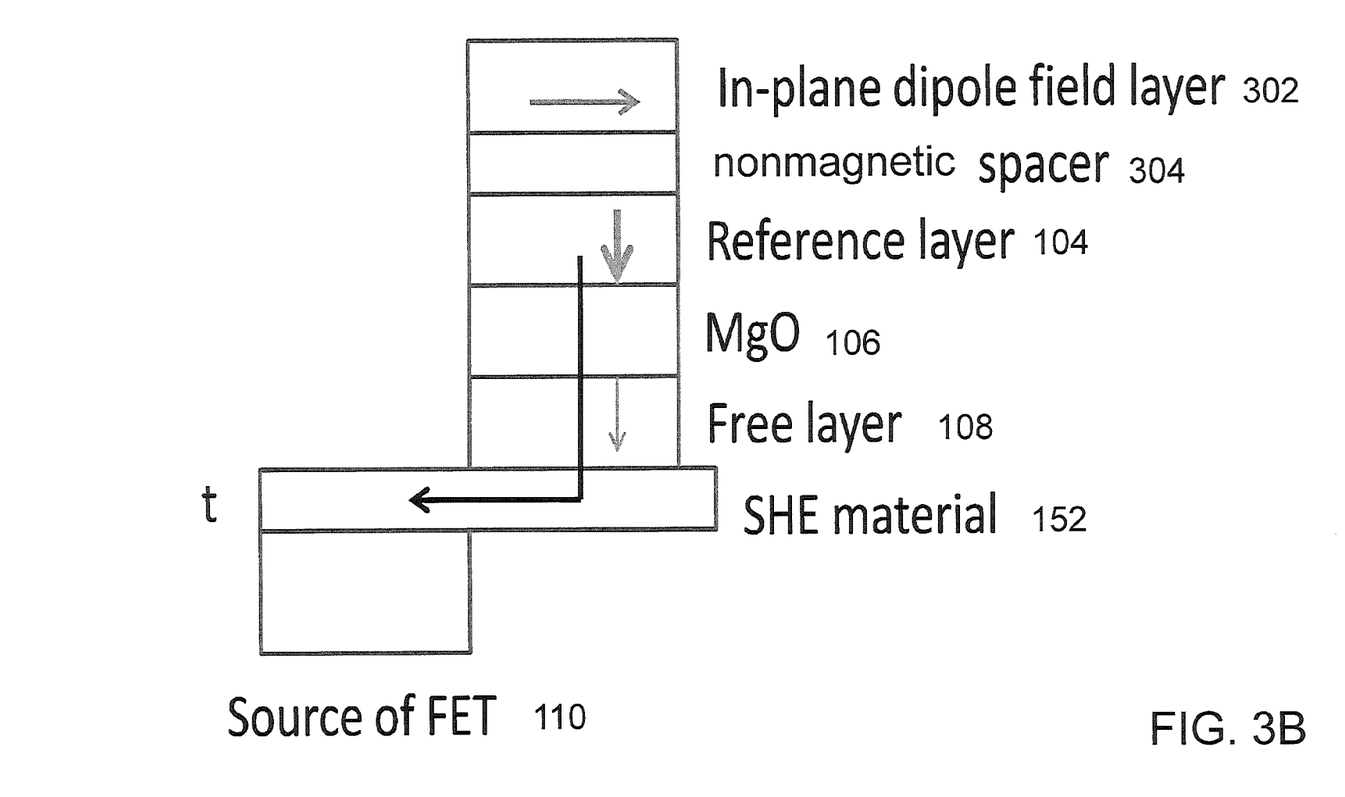
FIG. 3B is a block diagram for a STT-MRAM device incorporating an in-plane dipole field layer in accordance with one or more embodiments.

When the free layer 108 of the MTJ has a perpendicular anisotropy as in FIG. 3B, the spins from the SHE may be orthogonal to an equilibrium position of the free layer 108 and magnetic switching may be realized when the spin torque is larger than the anisotropy field torque.

A critical current density (jc0_SHE) may be calculated according to equation #10:

$$jc0\_SHE = (e/\hbar bar) * (mu0 * Ms * t\_free/theta) * 0.5 * H\_K, \quad \text{Equation \#10}$$

where t_free may correspond to the thickness of the free layer 108.

The critical current for the SHE switching (Ic0_SHE) may be calculated according to equation #11:

$$Ic0\_SHE = (e/\hbar bar) * (mu0 * Ms * V/theta) * (0.5 * t/d) \\ * 0.5 * H\_K \quad \text{Equation \#11}$$

Therefore, when the free layer has perpendicular anisotropy, the ratio between the critical current for the tunneling current switching and the SHE current switching may be given by equation #12:

$$\text{Ratio} = Ic0\_MTJ/Ic0\_SHE = (d/t) * alpha \quad \text{Equation \#12}$$

Figure 2:
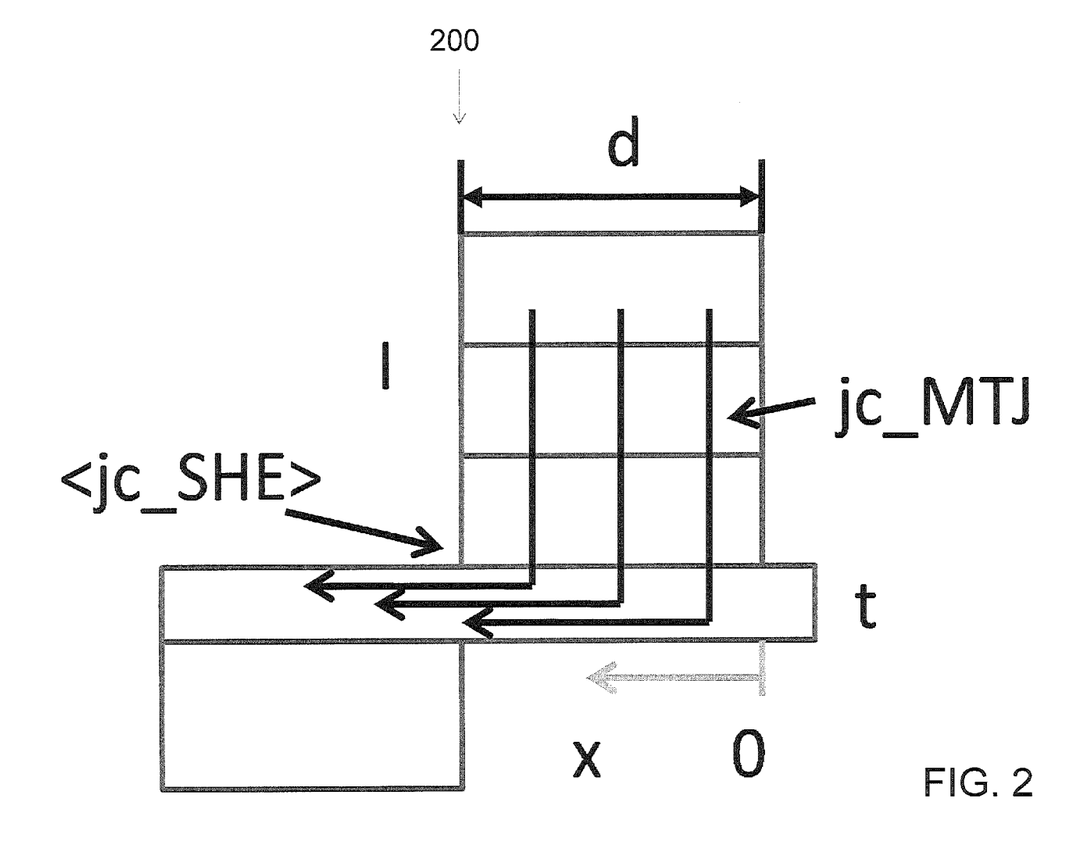
FIG. 2 is a block diagram for a STT-MRAM device in accordance with one or more embodiments.

For perpendicular magnetic anisotropy (PMA) materials with alpha on the order of 0.05, the ratio given be equation #12 is equal to one for MTJs with the dimensions/parameters shown for the device 200 in FIG. 2, meaning that in this structure, the spin hall effect and the MTJ tunneling current would have similar final influences on the dynamics of the free magnetic layer. The critical current for the structure/device 150 shown in FIG. 3B may be approximately one half of that experienced by the device 100 of FIG. 1A. For even larger values of d/t, the Ic0_MTJ/Ic0_SHE ratio given by equation #12 can be even larger than one and the critical current may be even smaller.

For SHE induced magnetic switching, an in-plane magnetic field may be necessary in order to obtain a deterministic switching polarity when the free layer has PMA (FIG. 3B). This in-plane magnetic field may be as small as approximately one-hundred Oersted (Oe) and can be provided by the dipole field from an in-plane magnetized ferromagnetic (FM) layer. As shown in FIG. 3B, an additional in-plane FM layer 302 may be inserted into the top of the MTJ which is exchange-biased by an anti-ferromagnetic layer and separated from the reference layer 104 by a nonmagnetic spacer layer 304. The dipole field from this FM layer 302 may be oriented in the film plane at the FL position and its magnitude may depend upon the thickness of the in-plane FM layer 302 and the distance from the in-plane FM layer 302 to the free layer 108.

Figure 4:
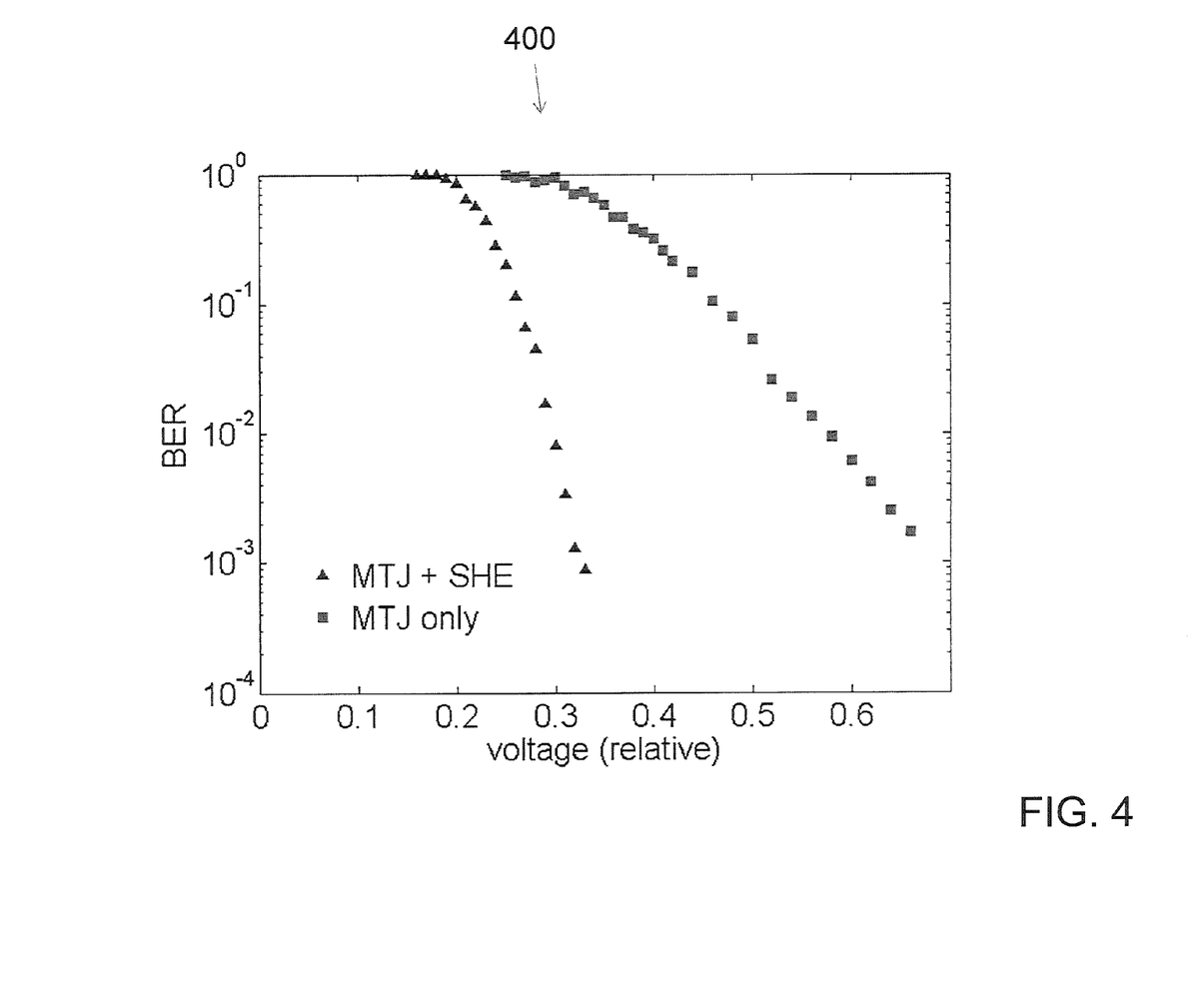
FIG. 4 is a graph of an error rate for current induced switching.

In addition to reducing the critical current, the SHE assisted STT-MRAM described above may provide an increased switching speed relative to conventional devices. In the anti-damping switching regime, the switching speed may highly depend on the initial angle between the reference layer and the free layer. It may take on the order of a few nanoseconds to build up the angle between the reference layer and the free layer and get enough efficiency for the spin torque to work. In the SHE induced switching for the perpendicular free layer case, the initial angle between the free layer moment and the injected spin orientation may be perpendicular to one another. So, even at the very beginning, there may be a large spin torque associated with SHE. The large spin torque from the SHE may reduce the time for switching. FIG. 4 illustrates an exemplary plot or graph 400 of the error rate for current induced switching for a conventional STT-MRAM and the SHE assisted STT-MRAM with perpendicular anisotropy when the pulse length is 1 nanosecond. As made clear by the graph 400, the SHE greatly reduces the switching time and the corresponding power needed for switching.

The material for the SHE layer 152 can be any single element, compound or alloy which has a large spin hall angle (e.g., a spin hall angle in an amount greater than a threshold). Since the spin hall effect is originated from the spin orbit scattering, materials with a large atomic number may be more readily used. Possible candidates include platinum, tantalum, tungsten, bismuth, as well as alloys based on these elements. The SHE layer 152 may be implemented as a wire.

Figure 5:
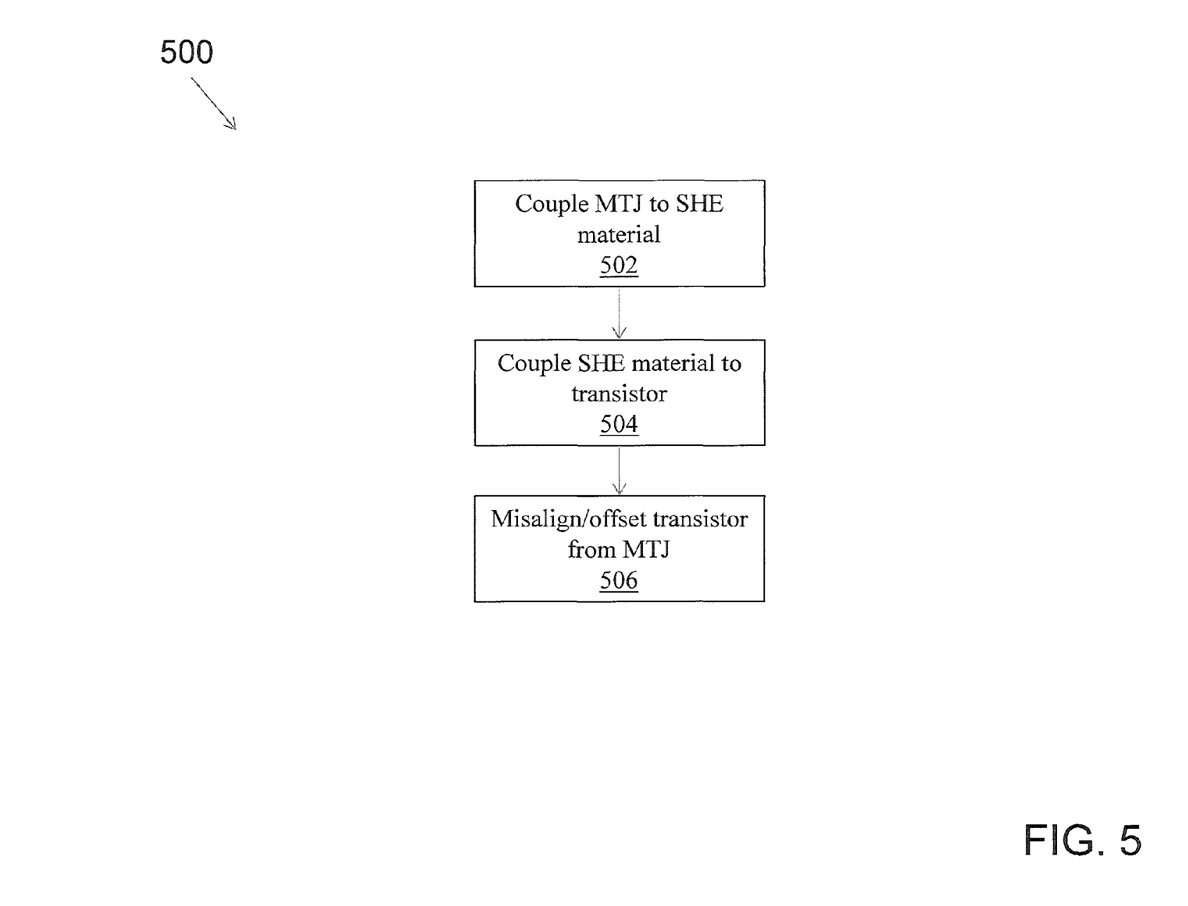
FIG. 5 is a flow chart of an exemplary method.

Turning now to FIG. 5, a flow chart of an exemplary method 500 in accordance with one or more embodiments is shown. The method 500 may be used to provide one or more devices, such as a SHE assisted STT-MRAM device.

In block 502, an MTJ may be coupled to SHE material. The MTJ may include one or more of a reference layer, an MgO layer, a free layer, an in-plane dipole field layer (for the perpendicular free layer case), and a nonmagnetic spacer. In some embodiments, the MTJ may couple to the SHE material via the free layer.

In block 504, the SHE material may be coupled to a transistor. For example, the SHE material may be coupled to a drain or source of a FET.

In block 506, the transistor may be offset or misaligned from the MTJ. Such an offset/misalignment may be used to induce a SHE in the SHE material by causing a current flowing through the MTJ to flow to one side or in one direction in the SHE material.

The method 500 is illustrative. In some embodiments, one or more of the blocks (or portions thereof) may be optional. In some embodiments, one or more blocks or operations not shown may be included. In some embodiments, the blocks or operations may execute in an order or sequence different from what is shown in FIG. 5.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

As will be appreciated by one skilled in the art, embodiments may be implemented as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Any combination of one or more computer readable medium(s) may be utilized, such as one or more non-transitory computer readable mediums. The computer readable medium may be a computer readable storage medium. A computer readable storage medium may be, for example, but not limited to, an electronic, magnetic, optical, electromagnetic, infrared, or semiconductor system, apparatus, or device, or any suitable combination of the foregoing. More specific example (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the steps may be performed in a differing order or steps may be added, deleted or modified. All of these variations are considered a part of the disclosure.

It will be understood that those skilled in the art, both now and in the future, may make various improvements and enhancements which fall within the scope of the claims which follow.

What is claimed is:

1. A method for providing a spin hall effect (SHE) assisted spin transfer torque magnetic random access memory (STT-MRAM) device comprising:
coupling a magnetic tunnel junction (MTJ) to a SHE material;
coupling the SHE material to a transistor, such that a source of the transistor abuts the SHE material; and
misaligning the SHE material and the transistor in order to cause a current that flows through the MTJ to flow in one direction in the SHE material to provide a SHE torque;
wherein one edge of the transistor is aligned to an edge of the SHE material, while an other edge of the transistor is aligned to an edge of the MTJ.

2. The method of claim 1, wherein the SHE material is implemented as a wire and has a thickness in the range of one nanometer to ten nanometers, inclusive.

3. The method of claim 1, wherein the SHE material comprises bismuth.

4. The method of claim 1, wherein the MTJ comprises an in-plane dipole field layer and a nonmagnetic spacer.

5. The method of claim 4, wherein the in-plane dipole field layer is coupled to the nonmagnetic spacer, and wherein the nonmagnetic spacer is coupled to a reference layer of the MTJ.

6. The method of claim 1, wherein the transistor comprises a field effect transistor (FET), and wherein one of a source and a drain of the FET is coupled to the SHE material.

7. The method of claim 1, wherein the MTJ comprises an in-plane magnetic field and a nonmagnetic spacer, and wherein the in-plane magnetic field is provided by a dipole field from an in-plane magnetized ferromagnetic (FM) layer, and wherein the in-plane magnetized FM layer is coupled to the nonmagnetic spacer.

8. The method of claim 7, wherein the nonmagnetic spacer is coupled to a reference layer of the MTJ.

\* \* \* \* \*